United States Patent
Yeouchung et al.

[11] Patent Number: 6,001,693
[45] Date of Patent: Dec. 14, 1999

[54] METHOD OF MAKING A METAL TO METAL ANTIFUSE

[76] Inventors: Yen Yeouchung, 1541 Elmar Way, San Jose, Calif. 95129; Shih-Oh Chen, 1246 Woodview Ter., Los Altos, Calif. 94024; Leuh Fang, 117 Cronin Dr., Santa Clara, Calif. 95051; Elaine K. Poon, 2306 Le Moyne Way, Campbell, Calif. 95008; James B. Kruger, 164 Kelly Ave., Half Moon Bay, Calif. 94019

[21] Appl. No.: 08/999,970

[22] Filed: Sep. 1, 1995

Related U.S. Application Data

[62] Division of application No. 08/319,170, Oct. 6, 1994, Pat. No. 5,541,441.

[51] Int. Cl.$^6$ .................................................. H01L 21/82
[52] U.S. Cl. ................................... 438/281; 437/195
[58] Field of Search ............................ 438/281; 437/195

[56] References Cited

U.S. PATENT DOCUMENTS

| | | | |
|---|---|---|---|
| 4,651,409 | 3/1987 | Ellsworth et al. | 29/576 |
| 4,748,490 | 5/1988 | Hollingsworth | 357/51 |
| 4,751,197 | 6/1988 | Wills | 437/174 |
| 4,796,075 | 1/1989 | Whitten | 357/51 |
| 4,822,753 | 4/1989 | Pintchovski et al. | 437/192 |
| 4,847,732 | 7/1989 | Stopper et al. | 361/395 |
| 4,870,302 | 9/1989 | Freeman | 307/465 |
| 4,899,205 | 2/1990 | Hamdy et al. | 357/51 |
| 4,912,066 | 3/1990 | Wills | 437/173 |
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 357/51 |
| 5,093,711 | 3/1992 | Hirakawa | 357/71 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/517 |
| 5,171,715 | 12/1992 | Husher et al. | 437/195 |
| 5,191,550 | 3/1993 | Kubota | 365/96 |
| 5,194,759 | 3/1993 | El-Ayat et al. | 307/202.1 |
| 5,196,724 | 3/1993 | Gordon et al. | 257/530 |
| 5,219,982 | 6/1993 | Bujisingh et al. | 528/392 |
| 5,233,206 | 8/1993 | Lee et al. | 257/50 |
| 5,233,217 | 8/1993 | Dixit et al. | 257/530 |
| 5,241,496 | 8/1993 | Lowrey et al. | 365/96 |
| 5,242,851 | 9/1993 | Choi | 437/49 |
| 5,248,632 | 9/1993 | Tung et al. | 437/195 |
| 5,250,459 | 10/1993 | Lee | 437/52 |
| 5,266,829 | 11/1993 | Hamdy et al. | 257/530 |
| 5,270,251 | 12/1993 | Cohen | 437/173 |
| 5,272,101 | 12/1993 | Forouhi et al. | 437/50 |
| 5,272,666 | 12/1993 | Tsang et al. | 365/96 |
| 5,284,788 | 2/1994 | Spratt et al. | 437/52 |
| 5,286,993 | 2/1994 | Lowrey et al. | 257/390 |
| 5,290,734 | 3/1994 | Boardman et al. | 437/195 |
| 5,293,133 | 3/1994 | Birkner et al. | 324/713 |
| 5,298,784 | 3/1994 | Gambino et al. | 257/529 |

(List continued on next page.)

FOREIGN PATENT DOCUMENTS

| | | | |
|---|---|---|---|
| 0 455 414 | 11/1991 | European Pat. Off. | H01L 23/525 |
| 87/02827 | 5/1987 | WIPO | H01L 27/24 |
| 92/13359 | 8/1992 | WIPO | H01L 21/285 |
| 93/03499 | 2/1993 | WIPO | H01L 23/525 |

*Primary Examiner*—Tom Thomas
*Assistant Examiner*—Douglas W. Owens
*Attorney, Agent, or Firm*—D'Alessandro & Ritchie

[57] ABSTRACT

The antifuse structure of the present invention includes a bottom planarized electrode, an ILD disposed over the bottom electrode, an antifuse cell opening in and through the ILD exposing the bottom electrode, a first barrier metal layer disposed in the antifuse cell opening to protect the antifuse material layer from diffusion from the bottom electrode and to form an effective bottom electrode of reduced area, hence reducing the capacitance of the device, an antifuse material layer disposed in the antifuse cell opening and over the first barrier metal layer, a second barrier metal layer disposed over the antifuse material layer, and a top electrode disposed over the second barrier metal layer.

4 Claims, 5 Drawing Sheets

U.S. PATENT DOCUMENTS

| | | | |
|---|---|---|---|
| 5,300,456 | 4/1994 | Tigelaar et al. | 438/195 |
| 5,302,546 | 4/1994 | Gordon et al. | 437/170 |
| 5,308,795 | 5/1994 | Hawley et al. | 437/195 |
| 5,322,812 | 6/1994 | Dixit et al. | 437/60 |
| 5,327,024 | 7/1994 | Cox | 307/465 |
| 5,328,865 | 7/1994 | Boardman et al. | 437/60 |
| 5,329,153 | 7/1994 | Dixit | 257/530 |
| 5,341,267 | 8/1994 | Whitten et al. | 361/56 |
| 5,353,246 | 10/1994 | Tsang et al. | 365/96 |
| 5,404,029 | 4/1995 | Husher et al. | 257/50 |
| 5,412,593 | 5/1995 | Magel et al. | 365/96 |

METHOD OF MAKING A METAL TO METAL ANTIFUSE

CROSS-REFERENCE TO RELATED APPLICATION

This is a divisional of patent application Ser. No. 08/319,170, filed Oct. 6, 1994, now U.S. Pat. No. 5,541,441.

BACKGROUND OF THE INVENTION

1. Field of the Invention

The present invention is directed to a metal-to-metal antifuse structure for use in microcircuit structures such as Field Programmable Gate Arrays (FPGAs) and the like. More particularly, the antifuse structure of the present invention comprises an antifuse cell opening in which is deposited a barrier metal over which is deposited the antifuse material layer and then another barrier metal layer. In this way the capacitance of the antifuse is reduced resulting in a device compatible with higher operating speeds.

2. The Prior Art

Prior art metal-to-metal antifuse structures generally comprise a planar bottom electrode on top of which is disposed a planar barrier metal layer. An interlayer dielectric layer (ILD) is disposed over the bottom electrode structure and an antifuse cell opening is formed in the ILD to expose the bottom electrode. An antifuse material layer may then be deposited in the antifuse cell opening (or "via") and appropriate layers deposited over the antifuse material layer. The problem with this approach is that it requires a thicker barrier layer on top of the bottom electrode which is not a standard process in CMOS backend technology. For manufacturability, it is desirable to have antifuse related processes impose as little change as possible on the process technology.

OBJECTS AND ADVANTAGES OF THE INVENTION

Accordingly, it is an object of the present invention to provide a metal-to-metal antifuse structure maximizing the use of standard process steps and therefore resulting in increased manufacturability.

It is a further object of the present invention to provide a metal-to-metal antifuse having a better step coverage for the top electrode disposed within the antifuse cell opening.

These and many other objects and advantages of the present invention will become apparent to those of ordinary skill in the art from a consideration of the drawings and ensuing description of the invention.

SUMMARY OF THE INVENTION

The antifuse structure of the present invention includes a bottom planarized electrode, an ILD disposed over the bottom electrode, an antifuse cell opening in and through the ILD exposing the bottom electrode, a first barrier metal layer disposed in the antifuse cell opening to protect the antifuse material layer from diffusion from the bottom electrode and to form an effective bottom electrode of reduced area, hence reducing the capacitance of the device, an antifuse material layer disposed in the antifuse cell opening and over the first barrier metal layer, a second barrier metal layer disposed over the antifuse material layer, and a top electrode disposed over the second barrier metal layer.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The present invention is directed to an improved metal-to-metal antifuse structure which maximizes the use of standard CMOS process flow.

Figure 1:
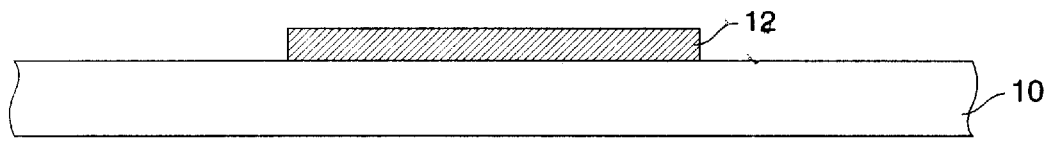
FIGS. 1–8 are diagrams showing progressive stages of construction of the metal-to-metal antifuse structure according to the present invention.
Figure 2:
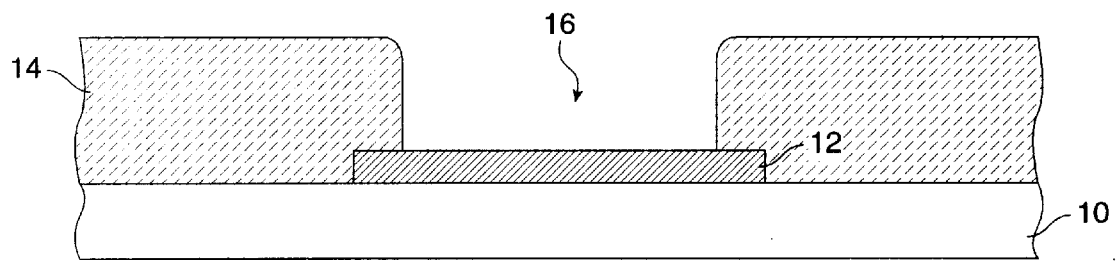
Figure 3:
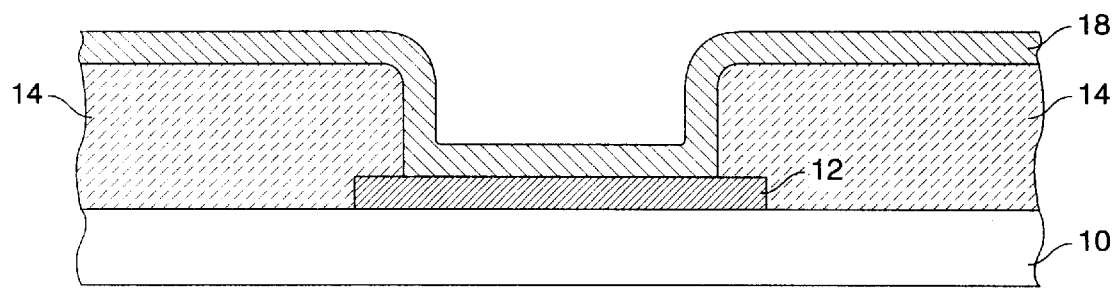

Turning to the drawings, FIG. 1 depicts a substrate 10 on which has been formed a bottom electrode 12 which will form the bottom antifuse electrode. The substrate may be any insulating portion of a microcircuit or semiconductor structure. Bottom electrode 12 is preferably aluminum of thickness in the range of 3000 Å–10000 Å with 5000 Å presently preferred. Bottom electrode 12 can also be any standard metallization compatible with standard CMOS processes. As shown in FIG. 2, over bottom electrode 12 is formed an interlayer dielectric layer (ILD) 14 preferably of oxide of thickness in the range of 3000 Å–10000 Å with 4000 Å presently preferred. Antifuse cell opening 16 is opened using conventional etching techniques through ILD 14 to expose bottom electrode 12 as shown. As shown in FIG. 3, a first barrier metal layer 18 is formed by a blanket deposit of a barrier metal material such as tungsten (W), titanium-tungsten (TiW), titanium-tungsten nitride (TiWN), titanium nitride (TiN), titanium (Ti), tungsten silicide (WSix), and combinations of the foregoing. Preferably barrier metal layer 18 is formed of TiN of thickness in the range of 1000 Å–3000 Å with 2000 Å presently preferred.

Figure 4:
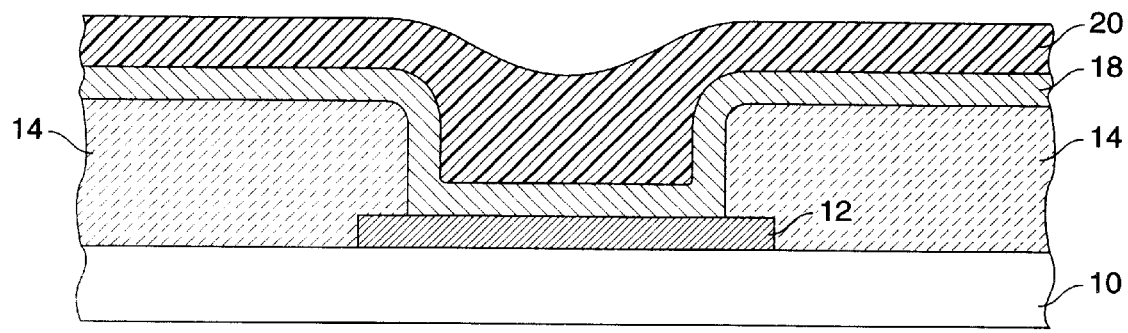
Figure 5:
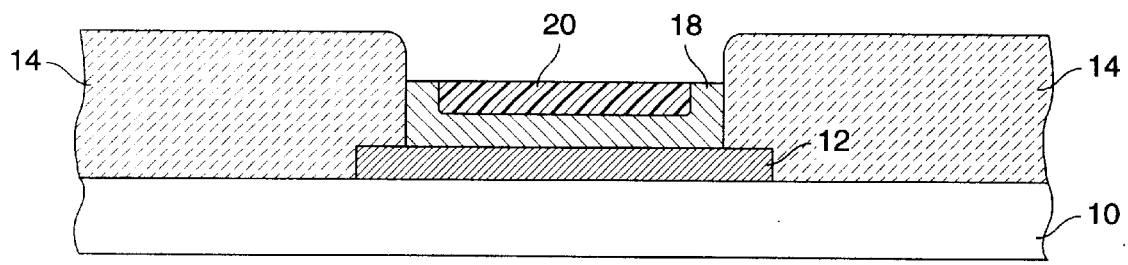
Figure 6:
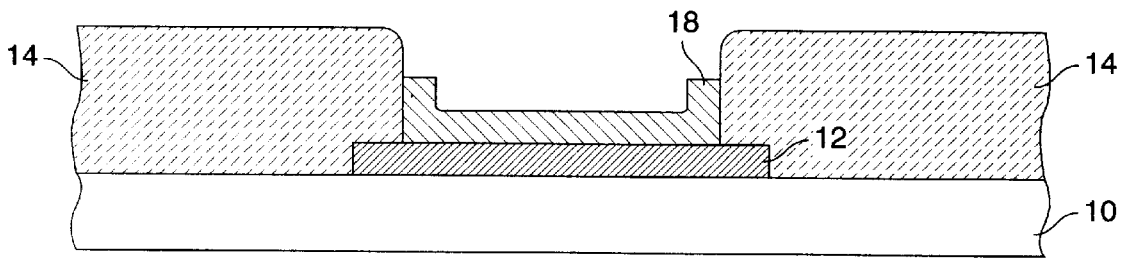
Figure 7:
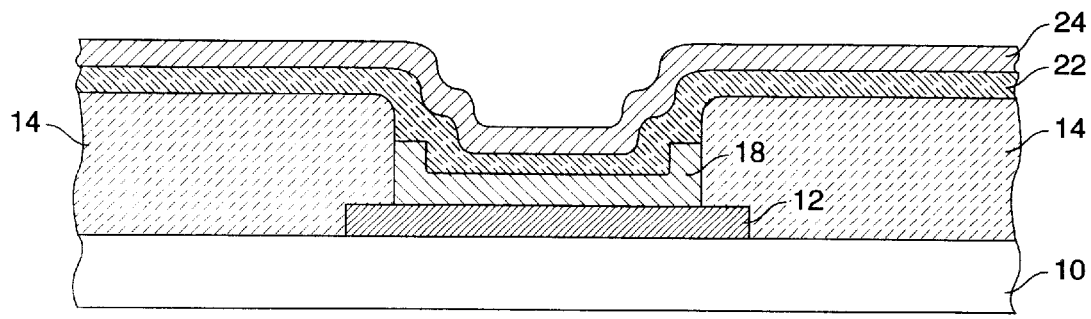

As shown in FIG. 4, a photoresist layer 20 of thickness in the range of 0.4–0.7 μm is spun on and then uniformly etched back to yield the structure of FIG. 5. Then the resist 20 remaining (FIG. 5) is stripped using conventional resist stripping techniques to yield the result shown in FIG. 6—a cup-shaped barrier metal layer 18 (Via 16 is preferably round when looking down on it).

Next, antifuse material layer 22 is deposited over first barrier metal layer 18. Antifuse material layer 22 is preferably formed of a conventional nitride-amorphous silicon-nitride sandwich where the first (lower) nitride layer is preferably of thickness in the range of 70 Å–200 Å with 100 Å presently preferred; the amorphous silicon layer is preferably of thickness in the range of 300 Å–1000 Å with 500 Å presently preferred; and the second (upper) nitride layer is preferably of thickness in the range of 70 Å–200 Å with 100 Å presently preferred. Over antifuse material layer 22 is preferably deposited second barrier metal layer 24 which is preferably formed by a blanket deposit of a barrier metal material such as W, TiW, TiWN, TiN, Ti, WSix, and combinations of the foregoing. Preferably second barrier metal layer 24 is formed of TiN of thickness in the range of 1000 Å–3000 Å with 2000 Å presently preferred.

Figure 8:
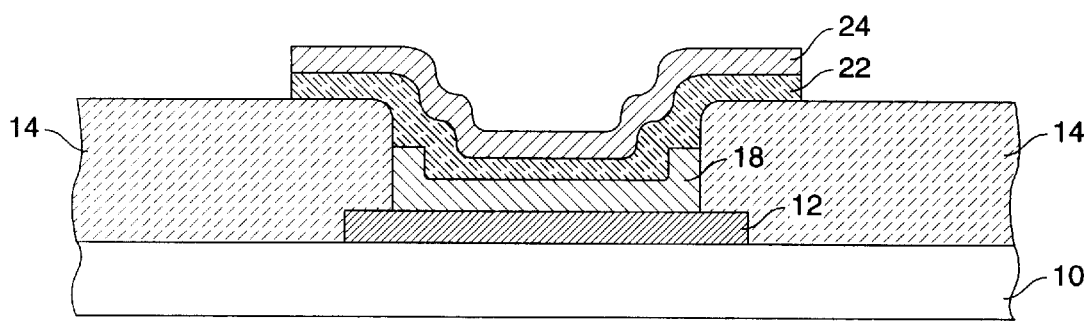
Figure 9:
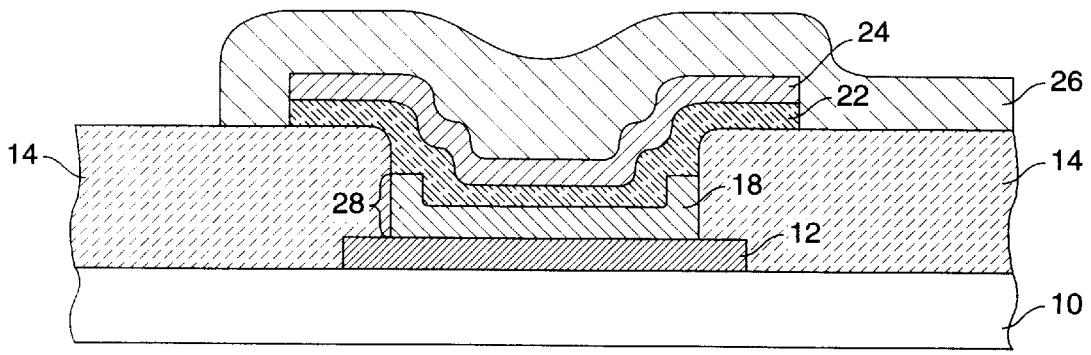
FIG. 9 is a diagram showing the completed metal-to-metal antifuse structure according to the present invention.

Next, as shown in FIG. 8, the antifuse cell is patterned and finally, as shown in FIG. 9, top electrode metallization layer 26 is formed over second barrier layer 24.

The benefits of this novel structure include its full compatibility with existing standard CMOS processes and particularly its compatibility with the standard CMOS metallization. Fuse capacitance is significantly reduced by the relatively smaller size of the first barrier metal layer versus the much larger size of the bottom electrode. Further control of the capacitance of the fuse is available by controlling the height of the sleeve 28 (FIG. 9). A shorter sleeve will give a lower fuse capacitance. Better step coverage is possible through the improved conformality for the antifuse material layer provided by the structure because the effective antifuse via depth is shallower due to the presence of the first barrier metal layer 18 within antifuse cell opening 16. Finally, a wide choice of barrier metals are available since the structure described imposes less restriction on the choice of a barrier material.

Figure 10:
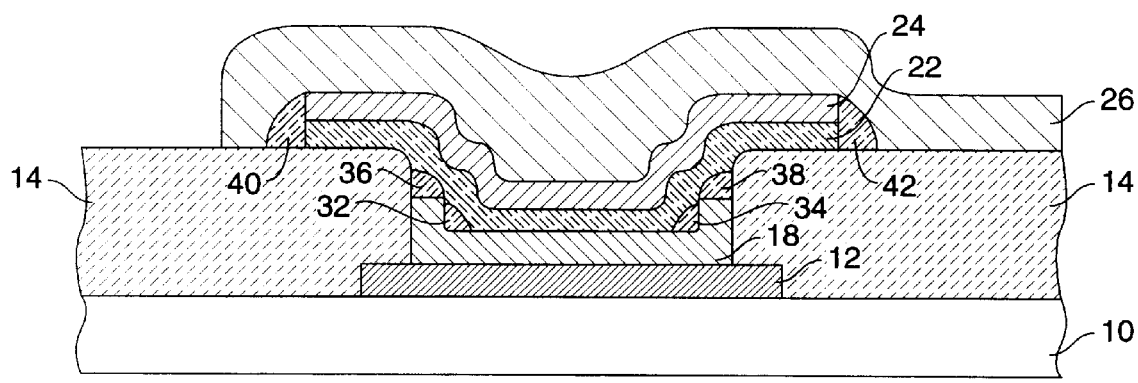
FIG. 10 is a diagram showing an alternative embodiment of the completed metal-to-metal antifuse structure according to the present invention.
Figure 11:
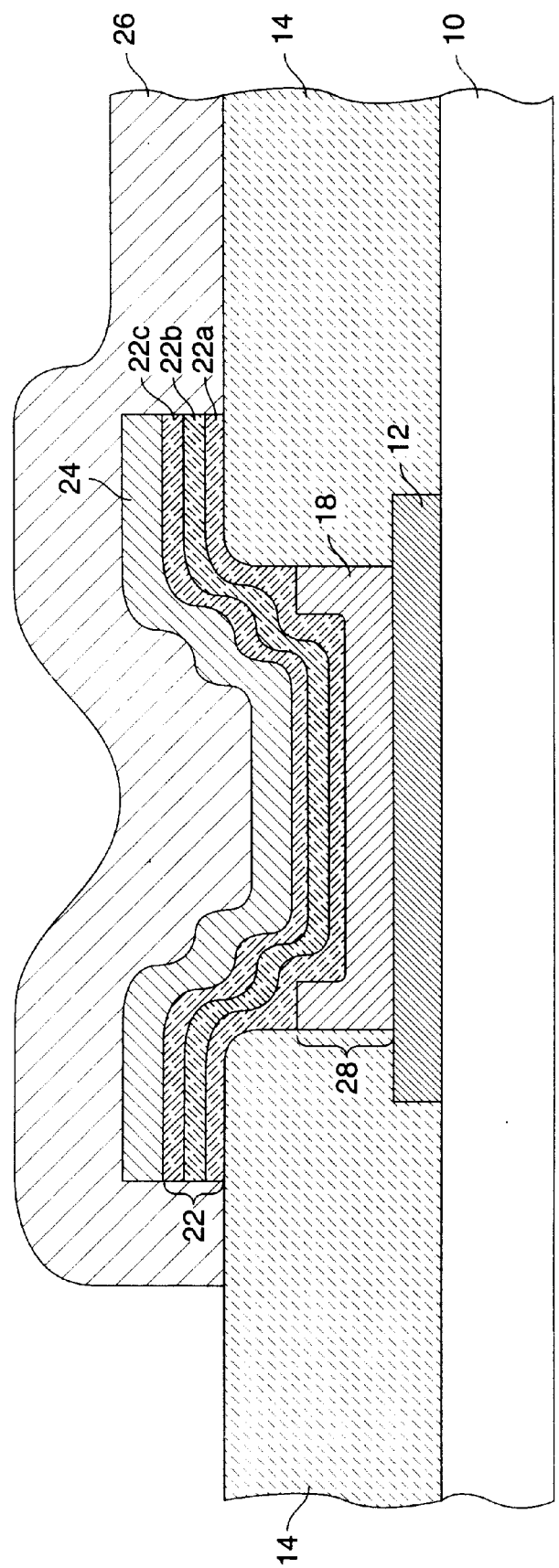
FIG. 11 is a diagram showing an alternative embodiment of the completed metal-to-metal antifuse structure according to the present invention.

According to an alternative embodiment of the present invention depicted in FIG. 10, spacers 32, 34, 36 and 38 may be added to further reduce corner effects and spacers 40, 42 reduce side diffusion associated with the top electrode 26. The spacers may be fabricated of silicon oxide, silicon nitride or amorphous silicon as is known to those of ordinary skill in the art.

Spacers 32, 34, 36 and 38 reduce the capacitance of the antifuse cell because they reduce the exposed area of bottom electrode 18. The spacer etch used for forming the spacer also serves the purpose of rounding corners 44, 46 of bottom electrode 18 as shown in FIG. 10 thus reducing the probability of antifuse defects resulting from sharp corners in the bottom electrode 18 at corners 44, 46.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A process for fabricating a metal-to-metal antifuse comprising the following steps:
    (a) forming a bottom electrode having an upper surface over an insulating portion of a microcircuit structure;
    (b) forming an interlayer dielectric layer over said bottom electrode;
    (c) etching an antifuse cell opening in and through said interlayer dielectric layer so as to expose a portion of said upper surface of said bottom electrode;
    (d) blanket depositing a first barrier metal layer over said interlayer dielectric layer and in said antifuse cell opening and over and in physical and electrical contact with said bottom electrode;
    (e) spin depositing a layer of photoresist over said first barrier metal layer;
    (f) etching back said photoresist and said first barrier metal layer so as to leave only a cup-shaped portion of said first barrier metal layer disposed in said antifuse cell opening;
    (g) stripping the remaining photoresist from within said cup-shaped portion;
    (h) depositing an antifuse material layer over and in said cup-shaped portion and over said interlayer dielectric layer;
    (i) depositing a second barrier metal layer over said antifuse material layer;
    (j) patterning and etching said antifuse material layer and said second barrier metal layer; and
    (k) forming a top electrode over said second barrier metal layer.

2. A process for fabricating a metal-to-metal antifuse according to claim 1 further including the following step which takes place between step (j) and step (k):
    (l) forming a spacer of an insulating material adjacent edges formed by step (j) in said antifuse material layer and said second barrier metal layer.

3. A process for fabricating a metal-to-metal antifuse according to claim 1 further including the following step which takes place between step (g) and step (h):
    (l) forming spacers of an insulating material in internal corners formed in said cup-shaped portion and between said cup-shaped portion and said antifuse cell opening.

4. A process for fabricating a metal-to-metal antifuse according to claim 2 further including the following step which takes place between step (g) and step (h):
    (m) forming spacers of an insulating material in internal corners formed in said cup-shaped portion and between said cup-shaped portion and said antifuse cell opening.

* * * * *